US006794915B2

(12) United States Patent
Goldgeisser et al.

(10) Patent No.: US 6,794,915 B2
(45) Date of Patent: Sep. 21, 2004

(54) MOS LATCH WITH THREE STABLE OPERATING POINTS

(76) Inventors: Leonid B. Goldgeisser, 17387 SW. Constance, Beaverton, OR (US) 97006; Michael M. Green, 20 Russell Ct., Irvine, CA (US) 92612; Xiaoqiang A. Shou, 1398 E. Hillcrest Dr., #223, Thousand Oaks, CA (US) 91362

( * ) Notice: Subject to any disclaimer, the term of this patent is extended or adjusted under 35 U.S.C. 154(b) by 0 days.

(21) Appl. No.: 09/993,191

(22) Filed: Nov. 5, 2001

(65) Prior Publication Data

US 2002/0089364 A1 Jul. 11, 2002

Related U.S. Application Data

(60) Provisional application No. 60/247,260, filed on Nov. 10, 2000.

(51) Int. Cl.[7] .............................................. H03K 3/356
(52) U.S. Cl. ..................... 327/208; 327/185; 327/210
(58) Field of Search ................... 327/57, 185, 198, 327/199, 208, 210, 215, 219, 211, 212, 214; 326/115, 57, 59; 365/205, 207

(56) References Cited

U.S. PATENT DOCUMENTS

| | | | | |
|---|---|---|---|---|
| 3,540,010 A | * | 11/1970 | Heightley et al. | 365/207 |
| 3,849,675 A | * | 11/1974 | Waaben | 327/493 |
| 4,701,718 A | * | 10/1987 | Wrathall et al. | 330/253 |
| 4,709,163 A | * | 11/1987 | Kasperkovitz | 327/538 |
| 4,816,706 A | * | 3/1989 | Dhong et al. | 327/57 |
| 6,124,741 A | * | 9/2000 | Arcus | 327/112 |

OTHER PUBLICATIONS

Goldgeisser, Leonid B. and Green, Michael M.: "Some Two–Transistor Circuits Possess More Than Three Operating Points": Proceedings of the International Symposium on Circuits and Systems, Jun. 1999, pp. V–302 through V–305.
Lee, Byeong Gi.: "Number of DC Solutions of Two–Transistor Circuits Containing Feedback Structures"; a dissertation for the degree Doctor of Philosophy in Engineering, 1982, University of California Los Angeles Library.

* cited by examiner

Primary Examiner—Long Nguyen
(74) Attorney, Agent, or Firm—Charles E. Krueger (57) ABSTRACT

A tristable latch circuit fabricated utilizing standard MOS process technology includes a biasing element for identically biasing the MOS transistors in triode (as opposed to saturation) to implement a third stable operating point.

2 Claims, 10 Drawing Sheets

MOS LATCH WITH THREE STABLE OPERATING POINTS

CROSS-REFERENCES TO RELATED APPLICATIONS

This application claims priority from U.S. provisional application Ser. No. 60/247,260 filed on Nov. 10, 2000 which is hereby incorporated by reference for all purposes.

BACKGROUND OF THE INVENTION

Figure 1:
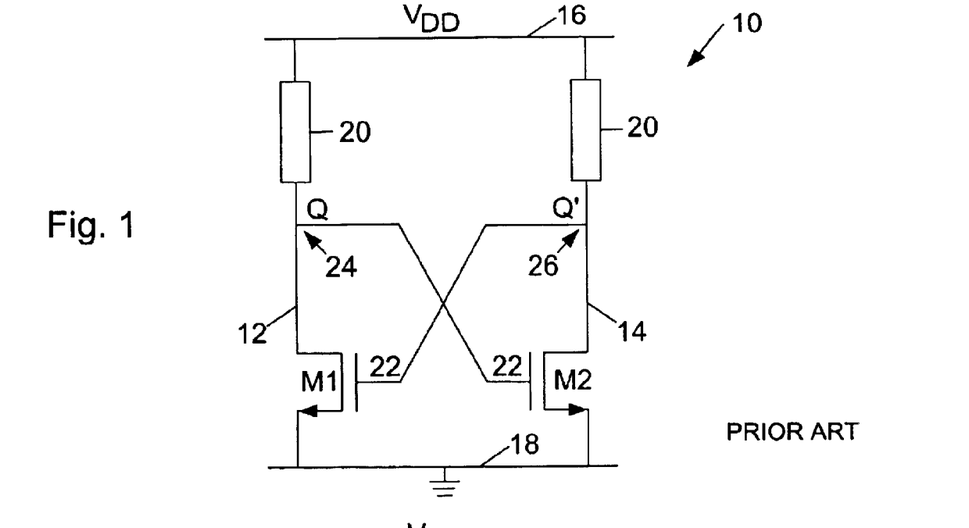
FIG. 1 is a schematic diagram of a latch circuit having an NMOS feedback structure.

A generic MOS latch is depicted in FIG. 1 where the latch 10 includes first and second series circuits 12 and 14 coupling first and second power supply terminals 16 and 18, in this case VDD and ground. Each series circuit includes a load 20 which could be, for example, a resistor or a current source, and NMOS transistors 22 (M1 and M2). A first terminal of the load 20 in the first series circuit is coupled to the first power supply terminal 16 and a second terminal of the load 20 is coupled to a first node 24. Similarly, a first terminal of the load 20 in the second series circuit is coupled to the first power supply terminal 16 and a second terminal of the load 20 is coupled to a second node 26. A feedback network couples the drain of one transistor to the gate of the other transistor, i.e., the gate of M1 is coupled to the second node 26 and the gate of M2 is coupled to the first node 24. The outputs, Q and Q' are also coupled, respectively, to the first and second nodes 24 and 26.

The operation of the latch in FIG. 1 will now be briefly described. If M1 is turned ON then current flows through the first series circuit and Q is pulled low. The gate of M2 is also coupled to a low voltage and turned off. Therefore, there is no current flow and no voltage drop across the load in the second series circuit 14 so that Q' is pulled high. This high voltage is also coupled to the gate of M1 to keep it ON. From symmetry another operating point exists for which M1 is OFF and M2 is ON.

An n-channel mosfet is said to be in triode when its gate-to-source voltage Vgs is greater than a threshold voltage Vt (this voltage is determined by the processing) and its gate-to-drain voltage Vgd is also greater than Vt. Thus, in each of the stable states of the standard bistable latch on transistor is OFF and the other is biased in triode.

An n-channel mosfet is said to be in saturation when its gate-to-source voltage Vgs is greater than Vt and its gate-to-drain voltage Vgd is less than Vt.

Figure 2:
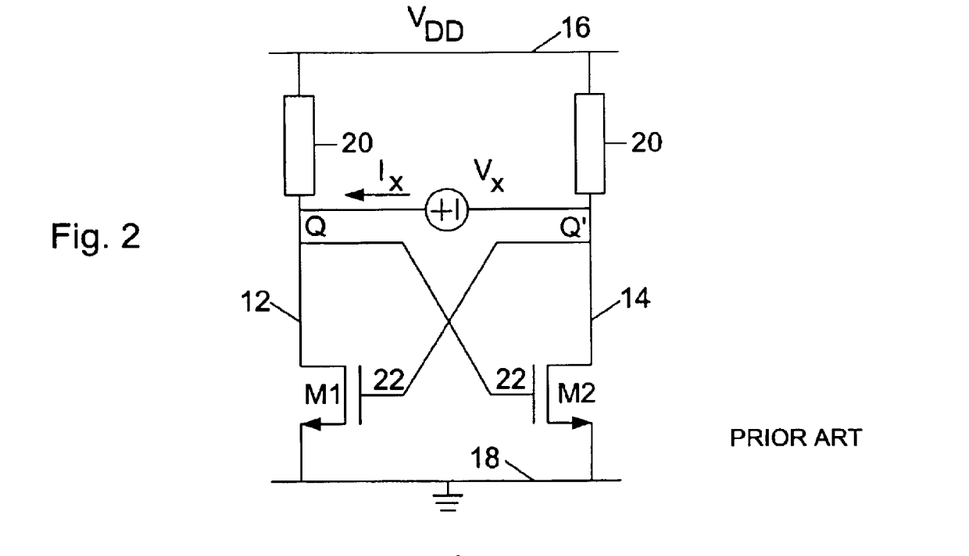
FIG. 2 depicts the circuit of FIG. 1 including an augmenting voltage source.
Figure 3:
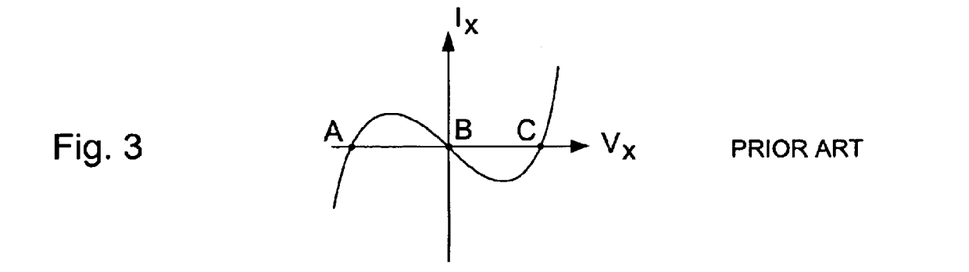
FIG. 3 is a graph depicting the operating points of the circuit of FIG. 2.

This circuit also possesses a third operating point, in which M1 and M2 are both biased in the saturation region and conduct equal currents. The presence of these three operating points can be verified by augmenting the circuit with voltage source $V_x$ as shown in FIG. 2. If $V_x$ is swept over an appropriate range, the values of $V_x$ for which $I_x=0$ correspond to the FIG. 1 circuit's operating points. An example of such a curve is shown in FIG. 3, where three operating points A, B and C are indicated. Operating point B corresponds to the third operating point mentioned above since nodes Q and Q' are at the same potential. The FIG. 3 curve passes through operating point B with a negative slope due to the feedback structure's loop gain being larger than unity at this operating point. For this operating point both transistors are biased in saturation. Using standard analysis methods, it is known that such an operating point must be unstable; hence, the circuit will never settle at operating point B. Therefore, the FIG. 1 circuit possesses two stable operating points.

The latch can be programmed to either stable operating point by applying an external perturbation to the outputs (e.g., by injecting differential impulse currents into Q and Q') to force the latch to a desired operating point.

It has been demonstrated that an MOS latch can possess more than two stable operating points. L. B. Goldgeisser and M. M. Green entitled "SOME TWO-TRANSISTOR CIRCUITS POSSESS MORE THAN THREE OPERATING POINTS," *Proc. Int. Symp. on Circuits & Systems*, pp. 302–305, Jun. 1999. A latch with three stable operating points, i.e., a "tristable latch", would be useful in logic circuits that employ three voltage levels (called "ternary logic") instead of two. Examples of ternary logic circuits include 3-state memory elements, $3^n$ digital counters, a 3-state phase detector for clock/data recovery circuits, content addressable memory, and sample and hold circuits.

Practical implementations of tristable latches have so far been difficult to achieve. An MOS tristable latch that utilizes multiple power supplies is described in the above-cited article. However, the circuit disclosed there possesses multiple power supplies. The use of a resonant tunneling diode (RTD) to realize a tri-stable latch is described in the article by Huber et al. entitled "An RTD/transistor Switching Block and its Possible Application in Binary and Ternary Adders," *IEEE Trans. on Electron Devices*, vol. 44, no. 12, Dec. 1997, pp. 2149–53.

However, tristable latches that can be fabricated using standard industry processes and that are practical for use in digital or mixed-signal circuitry are still needed to make ternary logic circuits that are economical and practical.

BRIEF SUMMARY OF THE INVENTION

According to one aspect of the invention, a tristable latch is constructed utilizing an integrated circuit processing technology that includes MOSFETs.

According to another aspect of the invention, in any standard (bistable) latch, there exists a direct connection from the gate of a first transistor to the drain of a second transistor, and vice-versa. The corresponding tri-stable topology is constructed by placing a resistive element (typically either a resistor or a diode-connected transistor) connected in series between the gate and drain of each such connection.

According to another aspect of the invention, the resistive element is a resistor.

According to another aspect of the invention, the resistive element is a diode-connected transistor.

According to another aspect of the invention, the tristable latch is used to latch one of the three states of a ternary input signal of a ternary logic device.

According to another aspect of the invention, a method for designing a tristable latch circuit includes the steps of simulating a circuit including a standard MOS latch and a feedback circuit including a biasing element and doing graphical analysis to determine the value of a characteristic of the biasing element so that the MOS latch including the biasing element has three stable operating points.

Other features and advantages will be apparent in view of the following detailed description and appended drawings.

DETAILED DESCRIPTION OF THE PREFERRED EMBODIMENTS

The invention will now be described with reference to the preferred embodiments. In the following, the term "standard digital CMOS process" refers to fully documented technologies utilized in making standard parts, for example, the HP 0.35 micron CMOS technology or the TSMC (Taiwan Semiconductor Manufacturing Corporation) 0.24 micron technology.

As described above, with reference to FIG. 1, in the stable states of a bistable latch, one transistor is biased in triode (full ON) and the other transistor is OFF. The feedback network stabilizes the latch at one operating point or the other.

Figure 4:
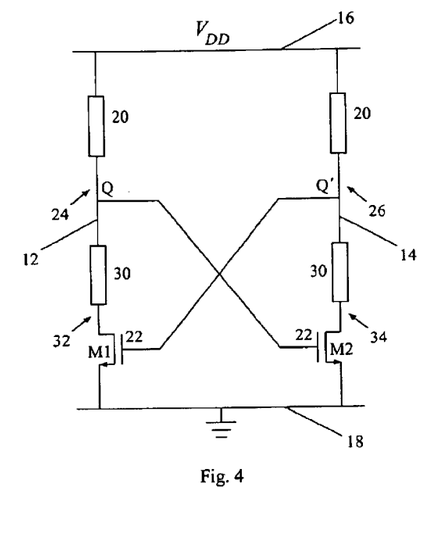
FIG. 4 is a schematic diagram of a latch circuit differing from the latch circuit of FIG. 1 by having a series element that allows the latch to possess a third, stable operating point.

The process of designing a tristable latch based on an NMOS feedback structure is illustrated in FIGS. 1 and 4. As described above, FIG. 1 depicts a standard bistable latch having an NMOS feedback structure. FIG. 4 depicts a latch circuit that includes a third operating point in addition to the two operating points described above. In FIG. 4 a biasing element 30 is included in each series circuit 12 and 14. This element is selected to allow both transistors (M1 and M2) to be identically biased (within part tolerances) in triode at the middle, symmetric operating point. (In contrast, in the FIG. 1 latch both transistors are biased in saturation in the middle, symmenric state) Since the transistors are in the FIG. 4 circuit are biased in triode at this operating point, the overall loop gain is less than unity, thereby making this third operating point stable.

In the first series circuit 12 of FIG. 4 the biasing element 30 couples the first node 24 to a third node 32 with the drain of M1 also coupled to the third node. In the second series circuit 14 the biasing element 30 couples the second node 26 to a fourth node 34 with the drain of M2 also coupled to the fourth node.

Figure 5:
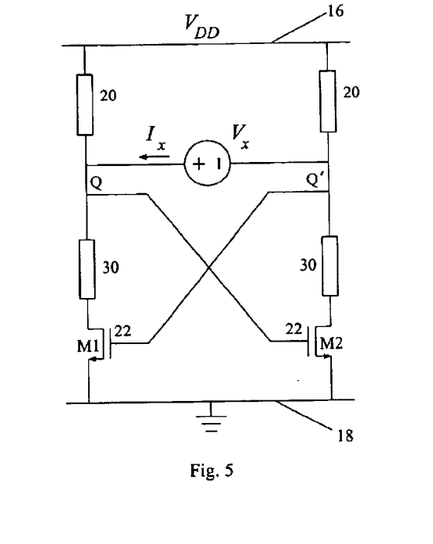
FIG. 5 depicts the circuit of FIG. 4 including an augmenting voltage source.
Figure 6:
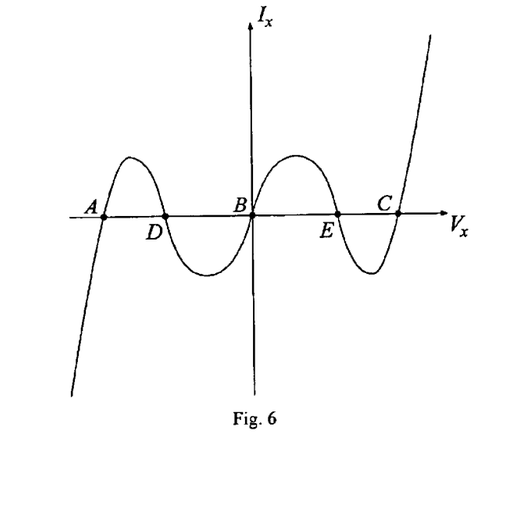
FIG. 6 is a graph depicting the presence of five operating points, three of which are stable, in the circuit of FIG. 5.

Accordingly, it is the biasing element elements 30 in the circuit of FIG. 4 that allows the latch to possess a third, stable operating point. The presence of three stable operating points can be verified by using the circuit shown in FIG. 5, which is similar to the one shown in FIG. 2. By selecting the appropriate characteristic of the series elements 30, a total of five operating points can be realized as illustrated in FIG. 6, which is similar to FIG. 3. Operating points A, B and C are stable (since the FIG. 6 curve passes through each of these operating points with positive slope) while D and E are unstable. Thus such a circuit possesses three stable operating points.

Figure 7A:
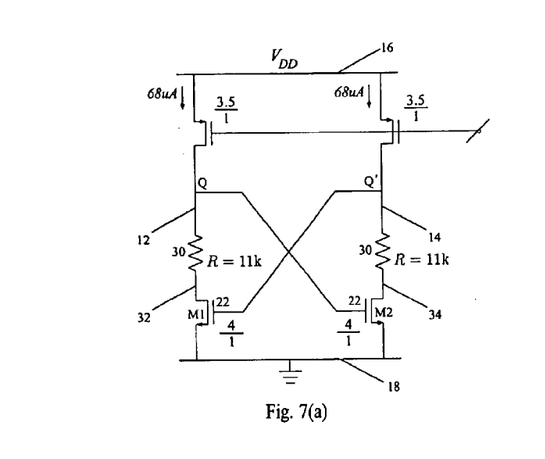
FIG. 7(a) is a schematic diagram of a latch circuit which is an implementation of the latch circuit of FIG. 4; all transistor dimensions are based on models of transistors available in the HP 0.35 micron CMOS process.

FIG. 7(a) depicts an example of tristable latch circuit implemented in MOS technology where biasing elements 30 are realized by resistors. The transistor dimensions are based on models of transistors available in the TSMC 2.5 micron CMOS process.

Figure 7B:
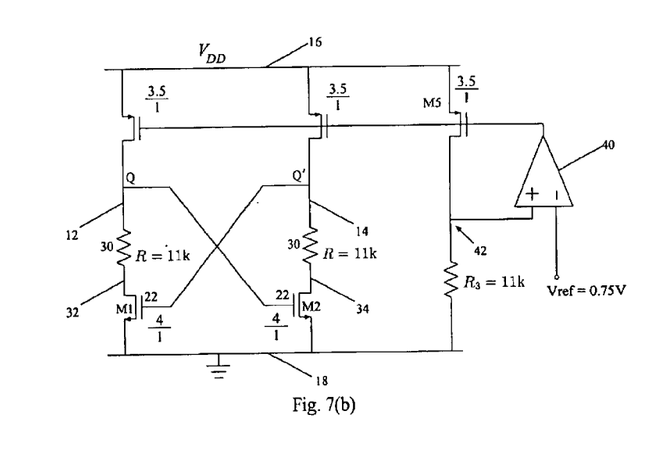
FIG. 7(b) is a schematic diagram of a latch circuit similar to FIG. 7(a) depicting an implementation for biasing the load transistors.

FIG. 7(b) depicts an implementation of the biasing of the circuit in FIG. 7(a). In FIG. 7(b) an Op-Amp 40 has its inverting input coupled to a reference voltage, $V_{ref}$, and its non-inverting input coupled to fifth node 42 in a voltage divider formed by a transistor M5 and a resistor R3. The circuit causes the IR drop across both of the biasing elements R to be equal to $V_{ref}$ at the symmetric third operating point.

Figure 8A:
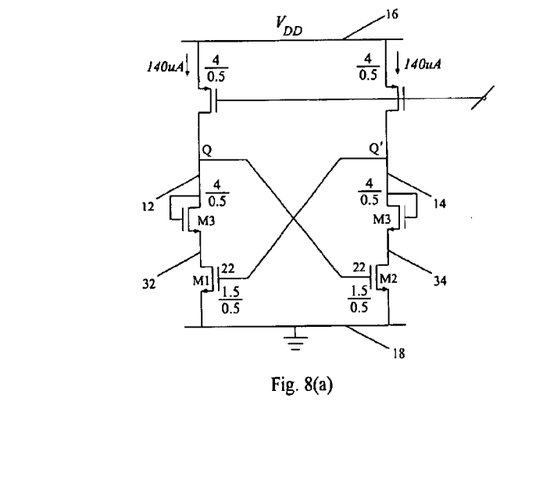
FIG. 8(a) is a schematic diagram of a latch circuit similar to FIG. 7(a) where the resistors are replaced by diode-connected transistors.

FIG. 8(a) depicts a circuit similar to that of FIG. 7(a) where the biasing elements 30 are diode-connected transistors M3 instead of resistors. The transistor dimensions are based on models of transistors available in the HP 3.5 micron CMOS process.

Figure 8B:
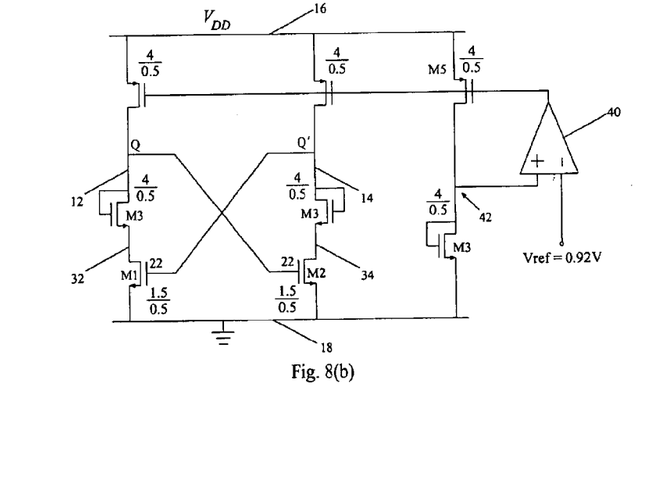
FIG. 8(b) is a schematic diagram of a latch circuit similar to FIG. 8(a) depicting an implementation for biasing the load transistors.

FIG. 8(b) depicts an implementation of the biasing of the circuit in FIG. 8(a). The operation of the biasing circuit is similar to the circuit used in FIG. 7(b). The same voltage drop, $V_{ref}$, occurs in both biasing elements.

Figure 9:
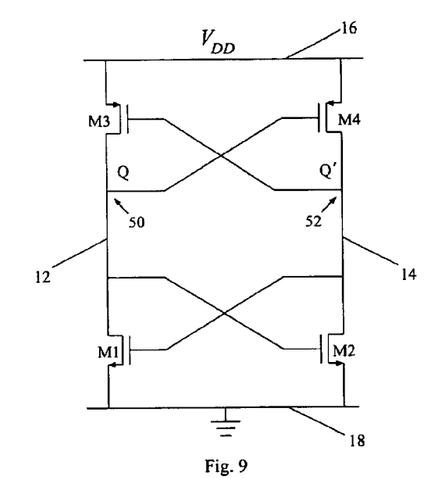
FIG. 9 is a schematic diagram of a standard CMOS latch circuit having an NMOS and PMOS feedback structure that possesses two stable operating points.
Figure 10:
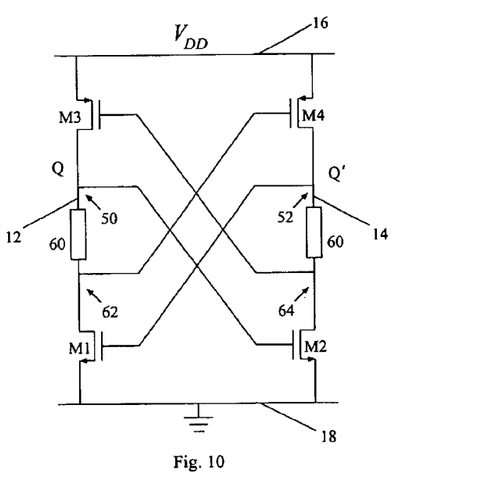
FIG. 10 is a schematic diagram of a latch circuit having a biasing element 60 to bias the NMOS and PMOS transistors that allows the latch to possess a third, stable operating point.

FIGS. 9 and 10 illustrate the process of designing a tristable CMOS latch based on an NMOS and PMOS feedback structure. In FIG. 9, which depicts a standard CMOS latch, the first series circuit 12 includes a PMOS (M3) transistor having a source terminal coupled to the first power supply terminal 16, a drain terminal coupled to a first node 50 and a gate terminal, and also includes an NMOS transistor (M1) having a drain terminal coupled to the first node 50, a gate terminal, and a source terminal coupled to the second power supply terminal 18. The second series circuit 14 includes a PMOS transistor (M4) having a source terminal coupled to the first power supply terminal 16, a drain terminal coupled to a second node 52 and a gate terminal, and also includes an NMOS transistor (M2) having a drain terminal coupled to the second node 52, a gate terminal, and a source terminal coupled to the second power supply terminal 18.

The gates of M3 and M1 and the output Q' are coupled to the second node 52 and the gates M2 and M4 and the output Q are coupled to the first node 50.

FIG. 10 depicts a latch circuit that includes a third stable operating point in addition to the two stable operating points described above. In FIG. 10 a biasing element 60 is included in each series circuit 12 and 14. The characteristics of these elements are selected to allow both NMOS transistors (M1 and M2) and both PMOS transistors (M4 and M5) to be identically biased at the middle, symmetric operating point (within part tolerances) in triode. Since these transistors are biased in triode at this operating point, the overall loop gain is less than unity, thereby making this operating point stable.

The biasing element 60 in the first series circuit 12 couples the first node 50 to a third node 62 which is coupled to the drain terminal of M. The biasing element 60 in the second series circuit 14 couples the second node 52 to a fourth node 64 which is coupled to the drain terminal of M2.

Figure 11:
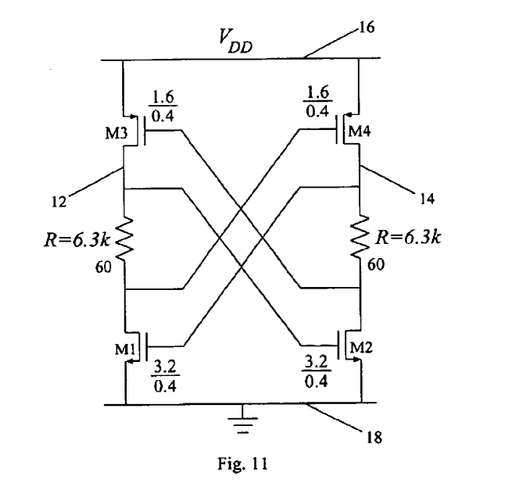
FIG. 11 is a schematic diagram of a latch circuit similar to FIG. 10 where the biasing elements are realized by resistors.
Figure 12:
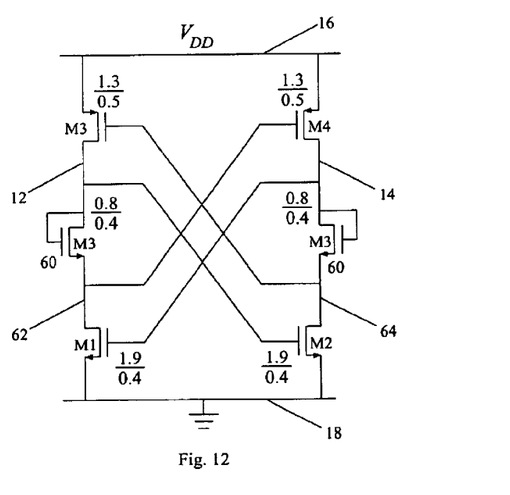
FIG. 12 is a schematic diagram of a latch circuit similar to FIG. 10 where the biasing elements are realized by diode-connected transistors.

FIG. 11 depicts a realization of the FIG. 10 circuit where the biasing elements 60 are resistors. The transistor dimensions are based on models of transistors available in the TSMC 2.5 micron CMOS process. FIG. 12 depicts a realization of the FIG. 10 circuit where biasing elements 60 are diode-connected transistors M3. The transistor dimensions are based on models of transistors available in the HP 3.5 micron CMOS process. The transistor dimensions are based on models of transistors available in the TSMC 2.5 micron CMOS process.

Figure 13:
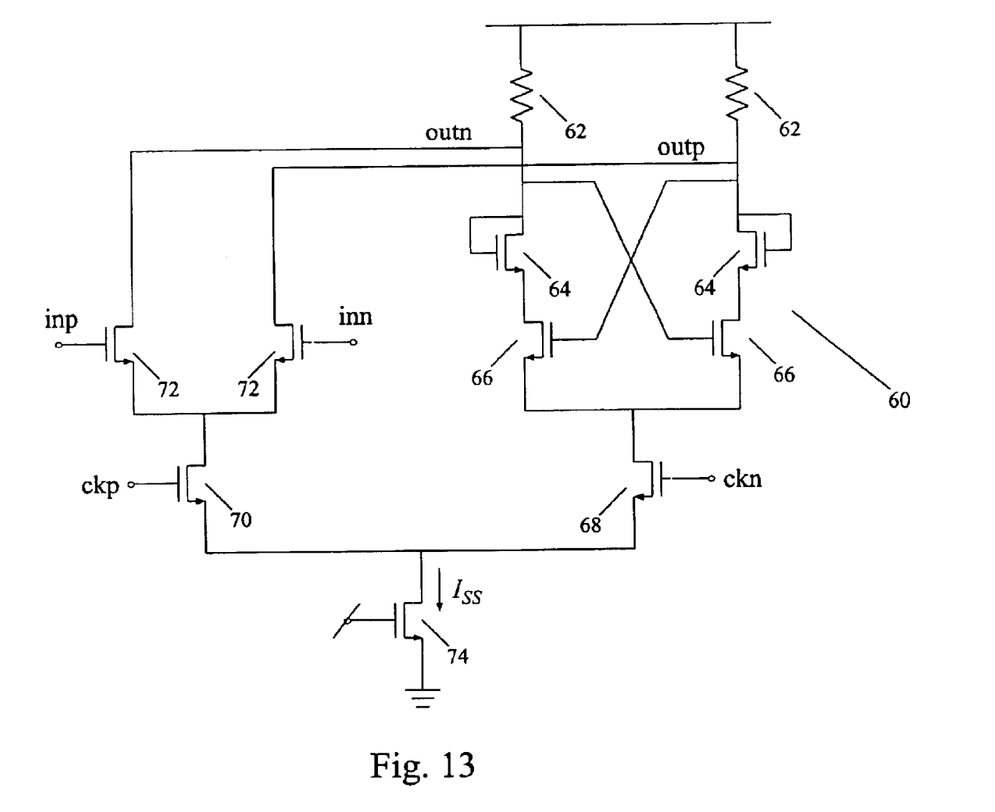
FIG. 13 is a schematic diagram of an implementation of the tristable latch circuit that is realized using a current-mode logic (CML) implementation.

FIG. 13 is a schematic diagram of an implementation of the tristable latch circuit that is realized using a current-mode logic (CML) implementation. In this circuit the biasing elements are the diode-connected transistors connected in series within the feedback structure. In FIG. 13 the tristable latch 60 includes a load resistor 62, biasing element 64, in this embodiment a diode connected transistor, and cross-coupled NMOS transistors 66 which have their sources coupled to a first clocking transistor 68. An input structure includes a pair of input NMOS transistors 72 having their sources coupled to a second clocking NMOS transistor 70. The sources of both clocking transistors 68 and 70 are coupled to a current source.

Figure 13A:
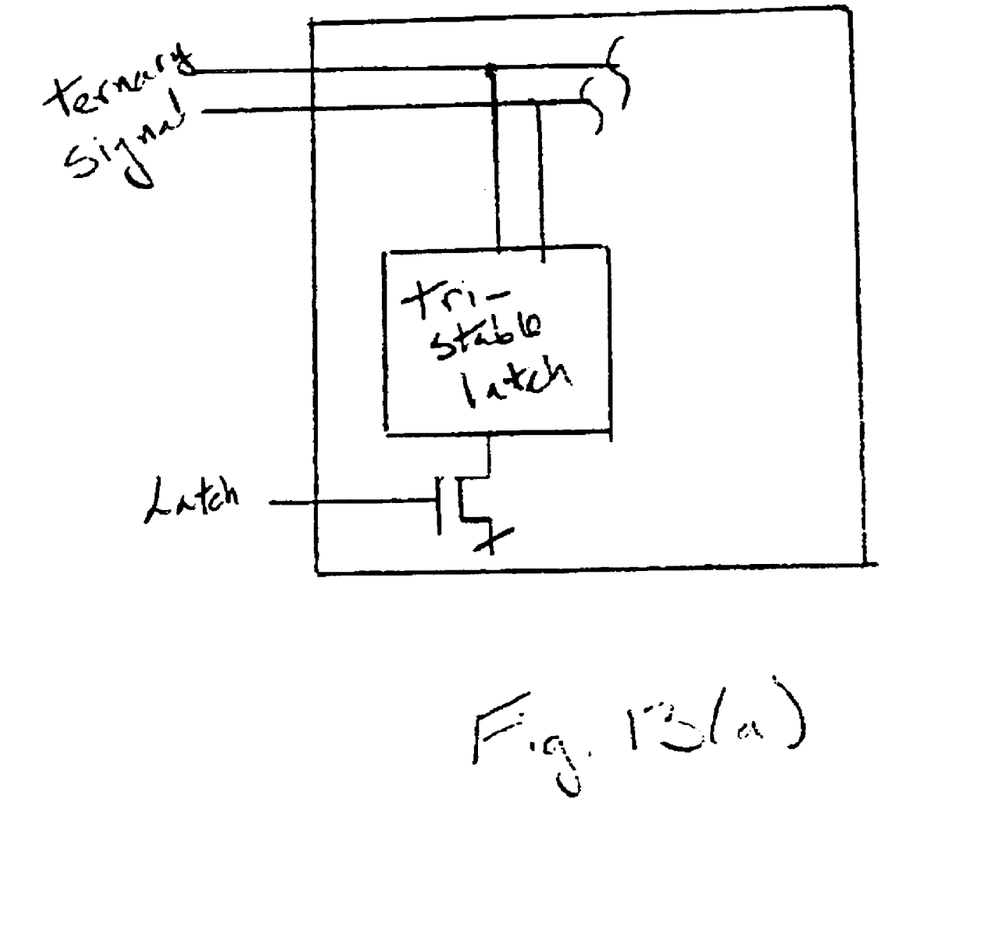
FIG. 13(a) is a schematic diagram of ternary logic circuit including a tristable latch.

This function of this circuit will now be described. When input voltage ckp is high and input voltage ckn is low, input voltges inp and inn are transferred directly into output voltages outp and outn. When ckp is low and ckn is high, the present values of the outputs are maintained by the latch structure independent of the inputs. In this circuit, the latch will hold any one of three states previously applied to the inputs: (1) voltage at inp higher than voltage at inn by some specified voltage logic level; (2) voltage at inp lower than voltage at inn by some specified voltage logic level; (3) equal voltages at inp and inn FIG. 13(a) depicts the use of the tristable latch in a ternary circuit, such as a $3^n$ counter or a 3-state phase detector. The tristable latch is connected to receive the ternary logic signals and to latch any of the three states when clocked by a trigger circuit.

Figure 14:
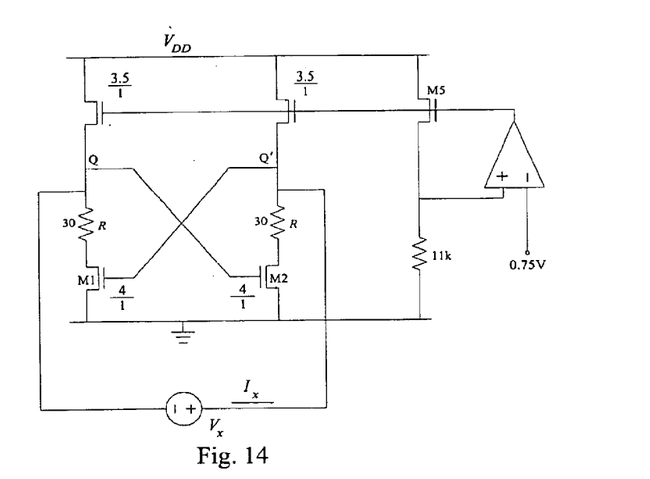
FIG. 14 depicts the circuit of FIG. 7(b) including an augmenting voltage source.
Figure 15:
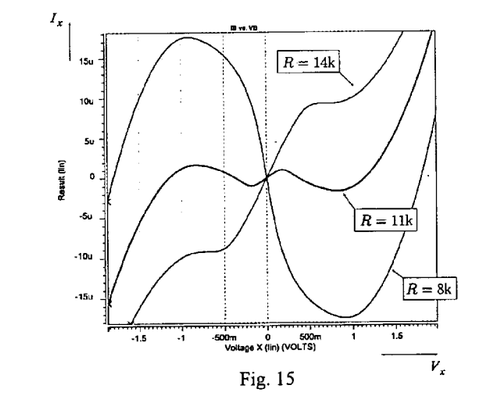
FIG. 15 is a graph of $I_x$ vs. $V_x$ for the circuit of FIG. 14 corresponding to three different values of R.

The methodology involved in designing latches with three stable operating points can be illustrated by using the analysis techniques illustrated in FIGS. 2, 3, 5 and 6. For example, the FIG. 7(b) tristable latch can be augmented with voltage source $V_x$ as shown in FIG. 14. FIGS. 14–24 depict schematics and simulations based on models of transistors available in the TSMC 2.5 micron CMOS process. The graphs of $I_x$ vs. $V_x$ for this circuit corresponding to three different values of R are shown in FIG. 15. From these graphs we can see that for R=8 k the $I_x$ vs. $V_x$ curve intersects I=0 three times, indicating that the FIG. 7(b) circuit (without voltage source $V_x$) possesses three operating points, two of which are stable. For R=14 k, the circuit possesses only one, stable operating point. However, for R=11 k, the circuit possesses five operating points, three of which are stable.

Figure 16:
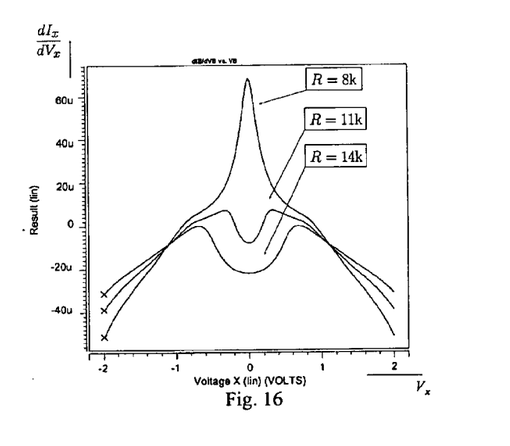
FIG. 16 is a graph of $dI_x/dV_x$ vs. $V_x$ for each of the curves of FIG. 14.

To gain even more insight into the situation, we now consider the derivatives of the three FIG. 15 curves, shown in FIG. 16. We can observe that the $dI_x/dV_x$ vs. $V_x$ curve corresponding to R=8 k intersects $dI_x/dV_x=0$ twice indicating that $I_x$ can have no more than two relative maxima or minima. Observation of the curve corresponding to the R=14 k proves more interesting. We observe for this case that although the $dI_x/dV_x$ never intersects 0, thus indicating that $I_x$ must be a monotonic function of $V_x$ and therefore can be 0 for only one value of $V_x$, $dI_x/dV_x$ itself is non-monotonic. This suggests that, given proper biasing, it might be possible for the curve to intersect $I_x=0$ four times, thus allowing the existence of five operating points. This is in fact exactly what happens for R=11 k. Here the two peaks in the derivative exist as in the R=14 k case; in addition, they intersect $dI_x/dV_x=0$ four times. Thus five operating points can exist as observed in FIG. 15.

Figure 17:
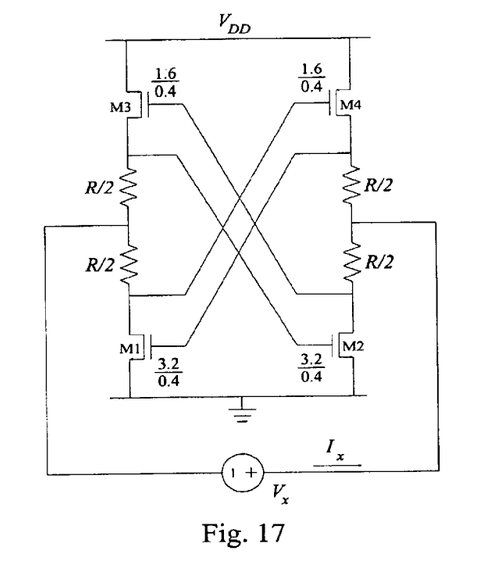
FIG. 17 depicts the circuit of FIG. 11 including an augmenting voltage source.
Figure 18:
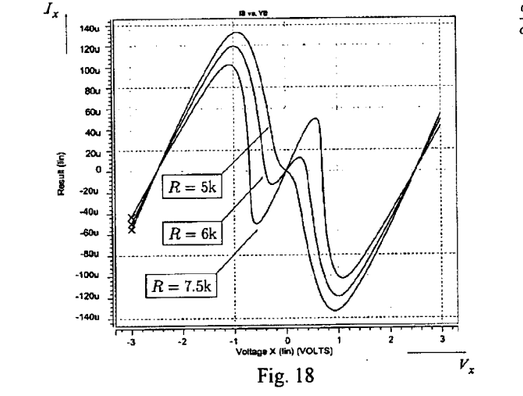
FIG. 18 is a graph of $I_x$ vs. $V_x$ for the circuit of FIG. 17 corresponding to three different values of R.
Figure 19:
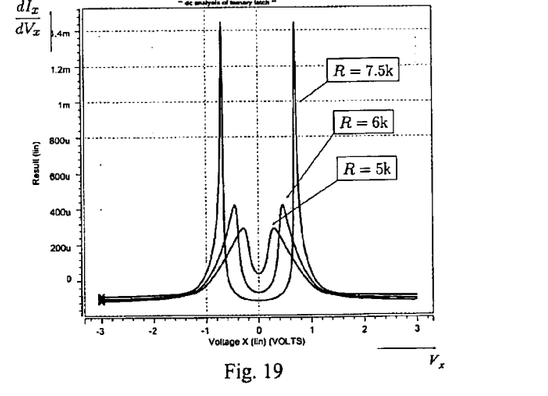
FIG. 19 is a graph of $dI_x/dV_x$ v. $V_x$ for each of the curves of FIG. 17.

The analysis outlined above is also applied to the FIG. 11 CMOS tristable latch. This latch is augmented with voltage source $V_x$ as shown in FIG. 17. The $I_x$ vs. $V_x$ curves corresponding to three values of R are shown in FIG. 18; the corresponding derivatives are shown in FIG. 19. In this case we observe that the peak in the derivative become stronger as the value of R increases. For this reason, the CMOS-type realization shown in FIG. 11 is more robust than the FIG. 7(a) version.

Figure 20:
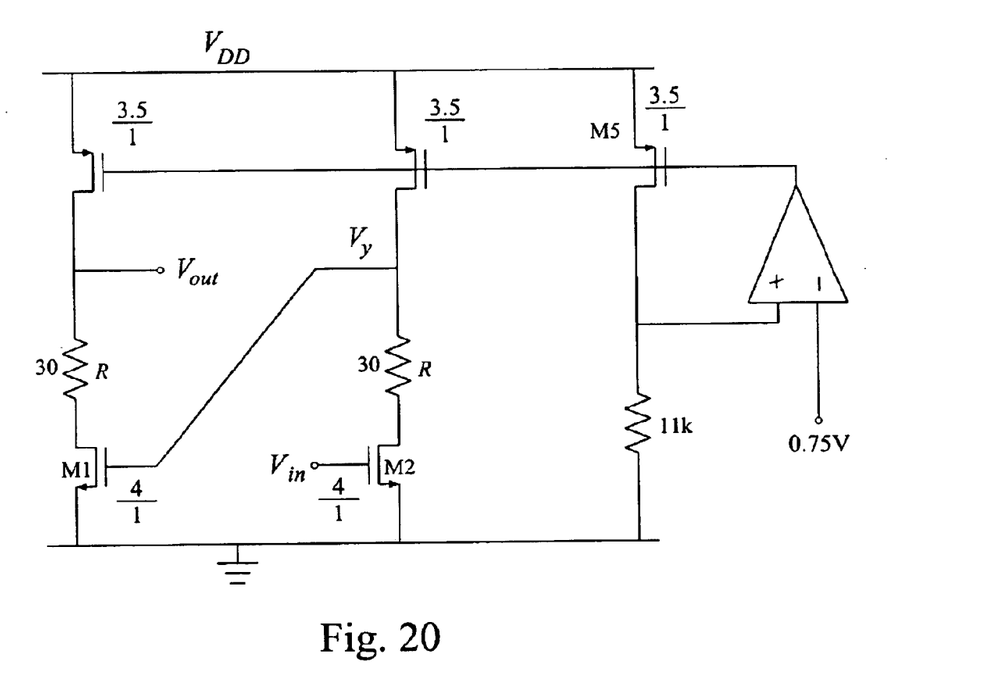
FIG. 20 is a schematic diagram of the circuit of FIG. 7(b) with its feedback loop broken.
Figure 21:
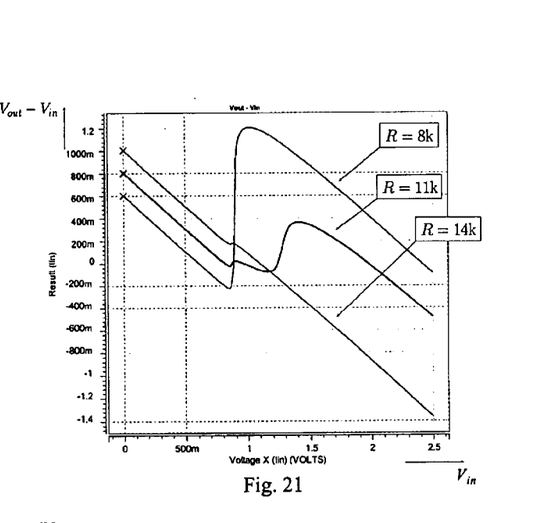
FIG. 21 is a graph showing $V_{out}$-$V_{in}$ corresponding to three different values of R.
Figure 22:
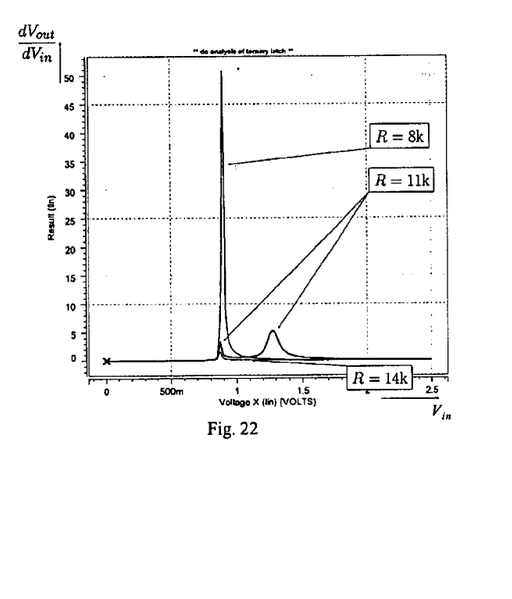
FIG. 22 is a graph showing $dV_{out}/dV_{in}$ for each of the curves of FIG. 21.

A different type of open-loop analysis can be performed on the FIG. 7(b) tristable latch that yields even more insight into the circuit's multistable behavior. FIG. 20 shows the FIG. 7(b) circuit with its feedback loop broken. A voltage $V_{in}$ is applied as shown, and swept over an appropriate value with voltage $V_{out}$ observed. Any value of $V_{in}$ for which $V_{out}=V_{in}$ corresponds to an operating point of the original FIG. 7(b) circuit. FIG. 21 shows curves for $V_{out}-V_{in}$ corresponding to three different values of R. As in the FIG. 15 case, we observe that for R=8 k, the circuit possesses three operating points; for R=11 k it possesses five operating points; and for R=14 k it possesses one operating point. For this analysis, an unstable operating point is identified by a positive slope of the curve as it passes through $V_{out}-V_{in}=0$. FIG. 22 shows the derivative $dV_{out}/dV_{in}$ corresponding to each of the three FIG. 21 curves. As before, the presence of two peaks, both above unity, is observed only for the R=11 k case. The open-loop circuit shown in FIG. 20 can be partitioned into two separate inverter stages. The first stage has input $V_{in}$ and output $V_y$; the second stage has input $V_y$ and output $V_{out}$. By the chain rule, we can write:

$$\frac{dV_{out}}{dV_{in}} = \frac{dV_y}{dV_{in}} \cdot \frac{dV_{out}}{dV_y} \quad \text{(EQ. 1)}$$

Figure 23:
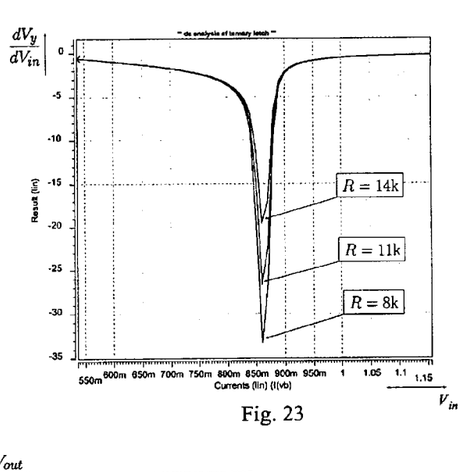
FIGS. 23 and 24 are graphs showing the derivatives of the right side of Eq. 1.
Figure 24:
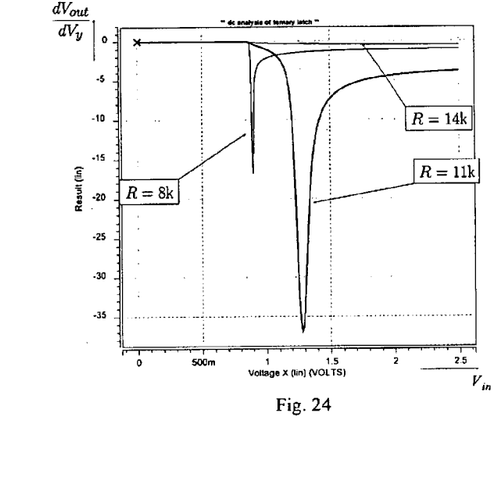

Each of the two derivatives on the right-hand side of the above equation is plotted vs. $V_{in}$ in FIGS. 23 and 24. We see from FIG. 23 that $dV_y/dV_{in}$ has only one negative peak and it is located near $V_{in}$=860 mV for any of the three resistor values shown. However, from FIG. 24 we see that the $dV_{out}/dV_y$ curve is highly dependent on the value of R. In particular, it is only for R=11 k that this derivative exhibits a significant peak near $V_{in}$=1.25 V, thereby allowing the presence of two peaks corresponding to R=11 k in the FIG. 22 curves.

Additional observations of the behavior of these circuits indicate that the realizations using diode-connected transistors as the biasing elements (i.e., FIG. 8(a) and FIG. 12) are more robust than the realizations using resistors (i.e., FIG. 7(a) and FIG. 11, respectively). The reason for this is that the inherent body effect of the diode-connected transistors changes the incremental resistance over the operating region in such a way that is more conducive to the presence of five operating points. It has also been observed that in general the CMOS realizations (i.e., FIG. 11 and FIG. 12) are more robust than the current source realizations (i.e., FIG. 7 and FIG. 8, respectively).

The invention has now been described with reference to the preferred embodiments. Alternatives and substitutions will now be apparent to persons of skill in the art. For example, although circuits utilizing the HP 0.35 micron CMOS technology and TSMC 0.25 micron technology have been described, other IC fabrication technologies that have MOSFETs available can be utilized based on the techniques described above. Different load devices from those described can also be utilized. Accordingly, it is not intended to limit the invention except as provided by the appended claims.

What is claimed is:

1. A tri-stable CMOS latch, having first and second inputs for receiving first and second input signals, respectively, where the first and second input signals have first and second signal levels, and with combinations or the signal levels of the first and second input signals defining first, second, and third ternary logic states, said tri-stable CMOS latch, comprising:

a first series circuit coupling first and second supply voltage terminals, with the first series circuit including a first PMOS transistor, including source, drain, and gate terminals coupling the first supply voltage terminal to a first node, a first biasing element coupling the first node to a second node, and a first NMOS transistor, including source, drain, and gate terminals coupling the second node to the second supply voltage terminal;

a second series circuit coupling the first and second supply voltage terminals, with the second series circuit including a second PMOS transistor, including source, drain, and gate terminals coupling the first supply voltage terminal to a third node, a second biasing element coupling the third node to a fourth node, and a second NMOS transistor, including source, drain, and gate terminals coupling the fourth node to the second supply voltage terminal;

a feedback network coupling the first node to the gate terminal of the second NMOS transistor, the second node to the gate terminal of the second PMOS transistor, the third node to the gate terminal of the first NMOS transistor, and the fourth node to the gate terminal of the first PMOS transistor;

with said first and second biasing elements, and said MOS transistors fabricated utilizing MOSFET technology, where said first and second biasing elements are diode-connected transistors, and with the first and second biasing elements creating unequal voltage drops to bias the PMOS and NMOS transistors in one of the first and second series circuits in a higher-current state and the PMOS and NMOS transistor of the other of the first and second series circuits in a lower-current state to achieve first and second stable operating points when the first and second input signals having signal levels defining a ternary signal in the first or second topiary logic states are received and creating substantially identical voltage drops to bias the PMOS and NMOS transistors in both the first and second series circuits in triode mode to achieve a third stable operating point, where the first and second PMOS and NMOS transistors conduct substantially the same current, when the first and second input signals having signal levels defining the third ternary logic state are received.

2. A MOS circuit comprising:

a current source;

a first clocking transistor having source, drain, and gate terminal with said source terminal coupled to the current source, where the first clocking transistor conducts when a first control signal, received at said gate terminal, is asserted;

a tristable MOS latch including:

first and second inputs for receiving first and second input signals, respectively, where the first and second input signals have first and second signal levels, and with combinations of the signal levels of the first and second input signals defining first, second, and third ternary logic states;

a first series circuit coupling a first supply voltage terminal to the drain terminal of said first clocking transistor, with the first series circuit including a first load element coupling the first supply voltage terminal to a first node, a first biasing element coupling the first node to a second node, and a first MOS transistor, including source, drain, and gate terminals coupling the second node to the drain terminal of said first clocking transistor, a second series circuit coupling a first supply voltage terminal to the drain terminal of said first clocking transistor, with the second series circuit including a second load element coupling the first supply voltage terminal to a third node, a second biasing element coupling the third node to a fourth node, and a second MOS transistor, including source, drain, and gate terminals coupling the fourth node to the drain terminal of said first clocking transistor;

a feedback network coupling the first node to the gate terminal of the second MOS transistor and third node to the gate terminal of the first MOS transistor;

with said first and second load elements, said biasing elements, and said MOS transistors fabricated utilizing MOSFET technology and with the first and second load and biasing elements creating unequal voltage drops to bias one of the MOS transistors in a higher-current state and the other MOS transistor in a lower-current state to achieve first and second stable operating points when the first and second input signals having signal levels defining the first or second ternary logic states are received and creating substantially identical voltage drops to bias the MOS transistors in triode mode to achieve a third stable operating point, where the first and second MOS transistors conduct substantially the same current when the first and second input signals having signal levels defining the third ternary logical state are received;

a second clocking transistor having source, drain, and gate terminal with its source terminal coupled to the current source, where the second clocking transistor conducts when a second control signal, received at said gate terminal, is asserted;

an input circuit including:

first and second circuits respectively coupling the first and third nodes to the drain terminal of the second clocking transistor, with the first circuit including a first input transistor having source, drain, and gate terminals, the first input transistor coupled to the first input to receive a first input signal at said gate terminal and with the second circuit including a second input transistor having source, drain, and gate terminals, the second input transistor coupled to the second input to receive a second input signal at said gate terminal;

where the tristable latch holds any of the first, second, or third ternary logic states applied to the first and second inputs when the first control signal is a asserted and the second control signal is not asserted.

* * * * *